(12) United States Patent
Hickerson et al.

(10) Patent No.: US 11,205,092 B2
(45) Date of Patent: Dec. 21, 2021

(54) CLUSTERING SIMULATION FAILURES FOR TRIAGE AND DEBUGGING

(71) Applicant: INTERNATIONAL BUSINESS MACHINES CORPORATION, Armonk, NY (US)

(72) Inventors: Bryan G. Hickerson, Cedar Park, TX (US); John Reysa, Austin, TX (US); Mohamed Baker Alawieh, Austin, TX (US); Brian Kozitza, Georgetown, TX (US); Erica Stuecheli, Austin, TX (US); Tuhin Mahmud, Austin, TX (US); Divya Joshi, Bangalore (IN)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 271 days.

(21) Appl. No.: 16/381,184

(22) Filed: Apr. 11, 2019

(65) Prior Publication Data

US 2020/0327364 A1 Oct. 15, 2020

(51) Int. Cl.
*G06F 16/00* (2019.01)
*G06K 9/62* (2006.01)
(Continued)

(52) U.S. Cl.
CPC ......... *G06K 9/6218* (2013.01); *G06F 16/906* (2019.01); *G06F 30/20* (2020.01); *G06K 9/6215* (2013.01); *G06N 20/00* (2019.01)

(58) Field of Classification Search
CPC ....... G06F 16/906; G06F 30/20; G06N 3/088; G06N 20/00; G06K 9/6215; G06K 9/6218

See application file for complete search history.

(56) References Cited

U.S. PATENT DOCUMENTS 7,191,364 B2  3/2007  Hudson et al.
8,782,609 B2  7/2014  Robinson
(Continued)

FOREIGN PATENT DOCUMENTS

EP   1376366 A2   1/2004

OTHER PUBLICATIONS

Z. Poulos et al, "Clustering-based Failure Triage for RTL Regression Debugging", IEEE, International Test Conference, 2014, pp. 1-10.

*Primary Examiner* — Shiow-Jy Fan
(74) *Attorney, Agent, or Firm* — Cantor Colburn LLP; Bryan Bortnick (57) ABSTRACT

Methods, systems and computer program products for clustering simulation failures are provided. Aspects include receiving simulation data comprising a plurality of simulation failure files, generating a token for each simulation failure file of the plurality of simulation failure files, determining a token score for each token for each simulation failure file of the plurality simulation failure files, normalizing each token score for each token in the plurality of simulation failure files utilizing a weighting scheme to create a normalized token score for each token, determining a set of groups for the plurality of simulation failure files, and assigning one or more simulation failure files from the plurality of simulation failure files into a group in the set of groups based at least in part on normalized token score.

18 Claims, 5 Drawing Sheets

(51) Int. Cl.
*G06N 20/00* (2019.01)
*G06F 16/906* (2019.01)
*G06F 30/20* (2020.01)

(56) References Cited

U.S. PATENT DOCUMENTS

| | | | |
|---|---|---|---|
| 9,296,474 B1* | 3/2016 | Nguyen | G05B 13/048 |
| 9,529,652 B2 | 12/2016 | Doppalapudi | |
| 9,940,187 B2 | 4/2018 | Jain | |
| 10,338,993 B1* | 7/2019 | Lekivetz | G06F 11/0709 |
| 2004/0194063 A1 | 9/2004 | Pereira | |
| 2005/0120273 A1* | 6/2005 | Hudson | G06F 11/366 |
| | | | 714/38.11 |
| 2006/0263833 A1* | 11/2006 | Loken | G01N 33/57492 |
| | | | 435/7.23 |
| 2007/0294200 A1* | 12/2007 | Au | G06F 16/338 |
| | | | 706/55 |
| 2011/0029523 A1* | 2/2011 | Castillo | G06F 11/26 |
| | | | 707/737 |
| 2012/0317058 A1* | 12/2012 | Abhulimen | G06N 3/0427 |
| | | | 706/2 |
| 2013/0081000 A1* | 3/2013 | Robinson | G06F 11/3692 |
| | | | 717/127 |
| 2014/0380286 A1* | 12/2014 | Gabel | G06N 5/022 |
| | | | 717/139 |
| 2016/0342720 A1 | 11/2016 | Veneris et al. | |
| 2020/0089786 A1* | 3/2020 | Cheng | G06F 16/29 |
| 2020/0177633 A1* | 6/2020 | Shivamoggi | G06F 16/285 |

* cited by examiner

CLUSTERING SIMULATION FAILURES FOR TRIAGE AND DEBUGGING

BACKGROUND

The present invention generally relates to simulation and debugging, and more specifically, to clustering simulation failures for triage and debugging.

In microprocessor simulation environments, debugging and triage are typically performed by engineers who analyze properties of test failures to attempt to determine the cause. However, the information provided by the test failures can be limited to generic descriptors that do not provide sufficient insight to the cause of the failure. In addition, thousands of test failures might include a same or similar descriptor for the test failure such as, for example, "time out." This can cause difficulty to resolve the test failures because one cannot determine if the test failure is caused by a single issue or multiple individual issues.

SUMMARY

Embodiments of the present invention are directed to a computer-implemented method for clustering simulation failures. A non-limiting example of the computer-implemented method includes receiving simulation data comprising a plurality of simulation failure files, generating a token for each simulation failure file of the plurality of simulation failure files, determining a token score for each token for each simulation failure file of the plurality simulation failure files, normalizing each token score for each token in the plurality of simulation failure files utilizing a weighting scheme to create a normalized token score for each token, determining a set of groups for the plurality of simulation failure files, and assigning one or more simulation failure files from the plurality of simulation failure files into a group in the set of groups based at least in part on normalized token score.

Embodiments of the present invention are directed to a system for clustering simulation failures. A non-limiting example of the system includes a processor configured to perform receiving simulation data comprising a plurality of simulation failure files, generating a token for each simulation failure file of the plurality of simulation failure files, determining a token score for each token for each simulation failure file of the plurality simulation failure files, normalizing each token score for each token in the plurality of simulation failure files utilizing a weighting scheme to create a normalized token score for each token, determining a set of groups for the plurality of simulation failure files, and assigning one or more simulation failure files from the plurality of simulation failure files into a group in the set of groups based at least in part on normalized token score.

Embodiments of the invention are directed to a computer program product for clustering simulation failures, the computer program product comprising a computer readable storage medium having program instructions embodied therewith. The program instructions are executable by a processor to cause the processor to perform a method. A non-limiting example of the method includes receiving simulation data comprising a plurality of simulation failure files, generating a token for each simulation failure file of the plurality of simulation failure files, determining a token score for each token for each simulation failure file of the plurality simulation failure files, normalizing each token score for each token in the plurality of simulation failure files utilizing a weighting scheme to create a normalized token score for each token, determining a set of groups for the plurality of simulation failure files, and assigning one or more simulation failure files from the plurality of simulation failure files into a group in the set of groups based at least in part on normalized token score.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 1:
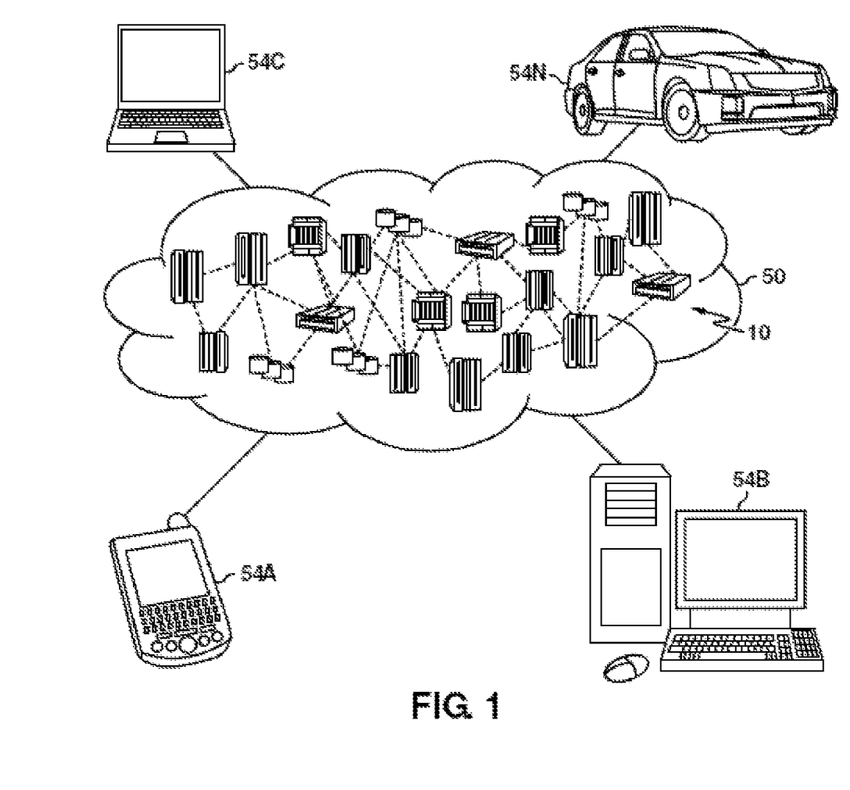
FIG. 1 depicts a cloud computing environment according to one or more embodiments of the present invention.

Referring now to FIG. 1, illustrative cloud computing environment 50 is depicted. As shown, cloud computing environment 50 comprises one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 1 are intended to be illustrative only and that computing nodes 10 and cloud computing environment 50 can communicate with any type of computerized device over any type of network and/or network addressable connection (e.g., using a web browser).

Figure 2:
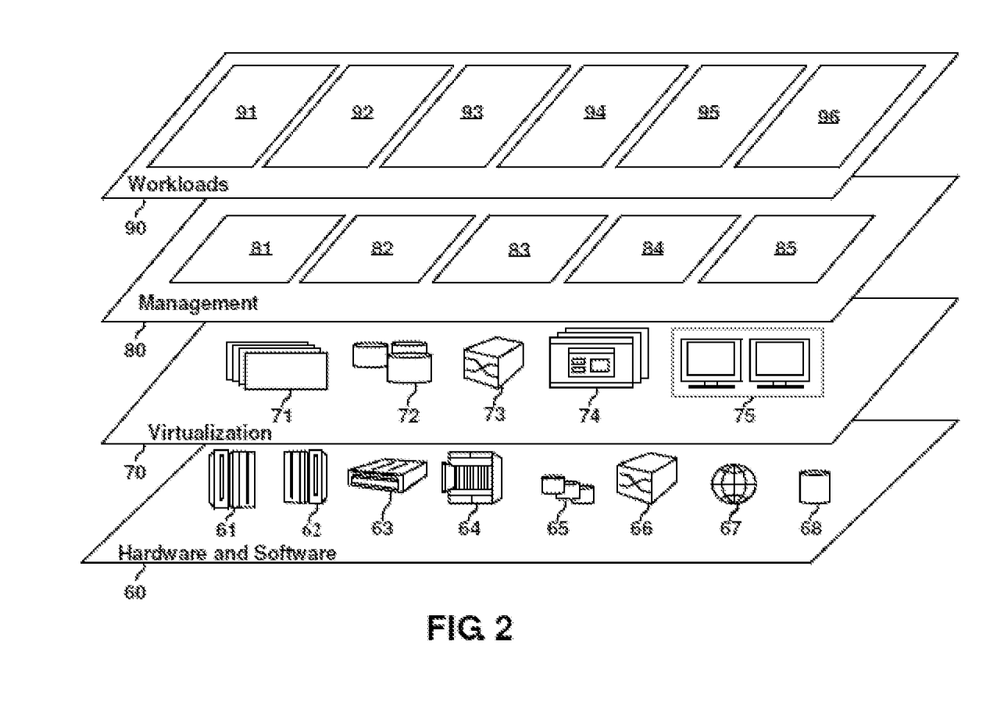
FIG. 2 depicts abstraction model layers according to one or more embodiments of the present invention.

Referring now to FIG. 2, a set of functional abstraction layers provided by cloud computing environment 50 (FIG. 1) is shown. It should be understood in advance that the components, layers, and functions shown in FIG. 2 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provides pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and clustering simulation failures for debugging and triage 96.

Figure 3:
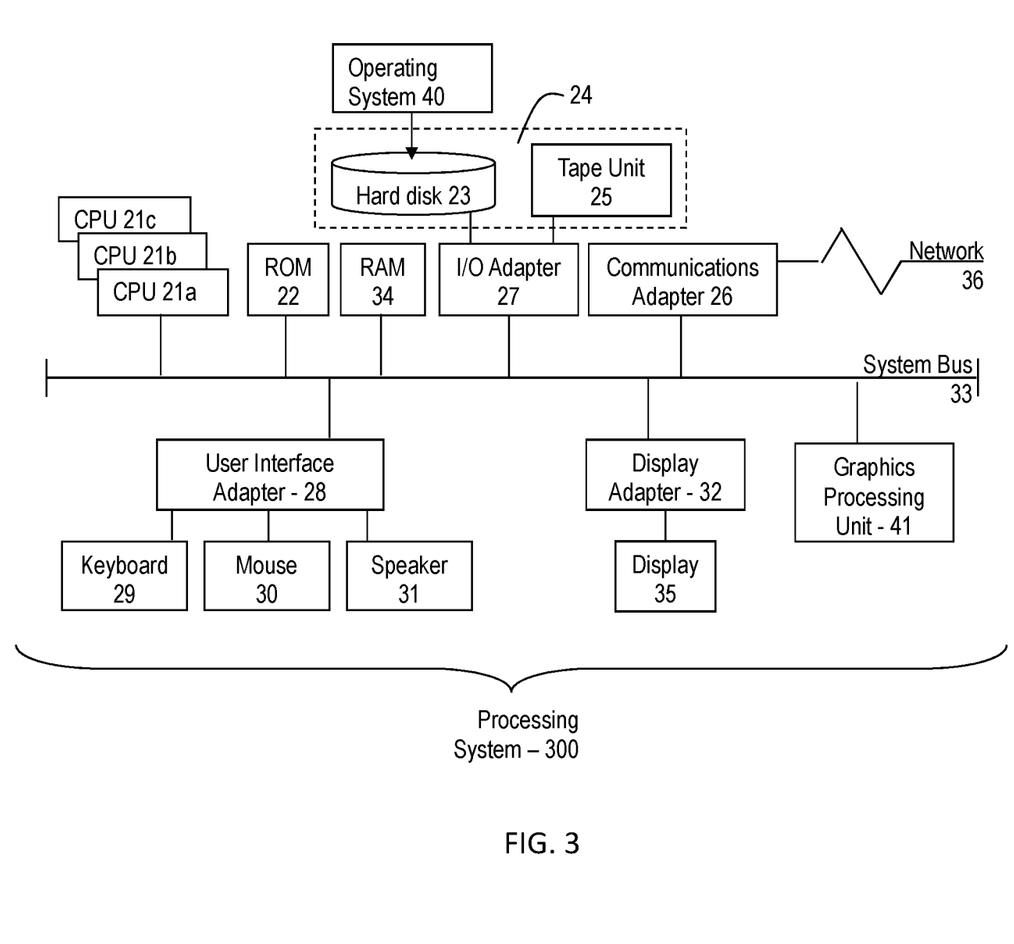
FIG. 3 depicts a block diagram of a computer system for use in implementing one or more embodiments of the present invention.

Referring to FIG. 3, there is shown an embodiment of a processing system 300 for implementing the teachings herein. In this embodiment, the system 300 has one or more central processing units (processors) 21a, 21b, 21c, etc. (collectively or generically referred to as processor(s) 21). In one or more embodiments, each processor 21 may include a reduced instruction set computer (RISC) microprocessor. Processors 21 are coupled to system memory 34 and various other components via a system bus 33. Read only memory (ROM) 22 is coupled to the system bus 33 and may include a basic input/output system (BIOS), which controls certain basic functions of system 300.

FIG. 3 further depicts an input/output (I/O) adapter 27 and a network adapter 26 coupled to the system bus 33. I/O adapter 27 may be a small computer system interface (SCSI) adapter that communicates with a hard disk 23 and/or tape storage drive 25 or any other similar component. I/O adapter 27, hard disk 23, and tape storage device 25 are collectively referred to herein as mass storage 24. Operating system 40 for execution on the processing system 300 may be stored in mass storage 24. A network adapter 26 interconnects bus 33 with an outside network 36 enabling data processing system 300 to communicate with other such systems. A screen (e.g., a display monitor) 35 is connected to system bus 33 by display adaptor 32, which may include a graphics adapter to improve the performance of graphics intensive applications and a video controller. In one embodiment, adapters 27, 26, and 32 may be connected to one or more I/O busses that are connected to system bus 33 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 33 via user interface adapter 28 and display adapter 32. A keyboard 29, mouse 30, and speaker 31 all interconnected to bus 33 via user interface adapter 28, which may include, for example, a Super I/O chip integrating multiple device adapters into a single integrated circuit.

In exemplary embodiments, the processing system 300 includes a graphics processing unit 41. Graphics processing unit 41 is a specialized electronic circuit designed to manipulate and alter memory to accelerate the creation of images in a frame buffer intended for output to a display. In general, graphics processing unit 41 is very efficient at manipulating computer graphics and image processing and has a highly parallel structure that makes it more effective than general-purpose CPUs for algorithms where processing of large blocks of data is done in parallel.

Thus, as configured in FIG. 3, the system 300 includes processing capability in the form of processors 21, storage capability including system memory 34 and mass storage 24, input means such as keyboard 29 and mouse 30, and output capability including speaker 31 and display 35. In one embodiment, a portion of system memory 34 and mass storage 24 collectively store an operating system coordinate the functions of the various components shown in FIG. 3.

Turning now to an overview of technologies that are more specifically relevant to aspects of the invention, current microprocessor simulation environments, typically, rely on humans to triage and debug test failures. These failures are often categorized by the first error message generated. Unfortunately, some of these messages can be very general, such as, for example, "timeout" or "expected data miscompare." These general failure messages can manifest into thousands of identically marked fails, making it a challenge to triage since it is unknown whether there is a common single fail mechanism or if there exists other unique causes of this failure among the group. If an engineer is able to differentiate the causing fail mechanisms then they can distribute them as a separate item to be debugged in parallel, thus shortening the design verification cycle. This has drawbacks as debugging must be performed manually or an engineer must develop scripts to decide how to group the fails. A manual approach is time consuming and error prone. The scripting approach is problematic because it only is useful for dealing with previous failure mechanisms and because it is constrained specifically to a portion of the design and is not a general solution across a design space.

Turning now to an overview of the aspects of the invention, one or more embodiments of the invention address the above-described shortcomings of the prior art by providing a tool that helps verification design engineers by allowing them to select a group of fails and gain intuition of which fails under a given general category are similar and which are dissimilar. This approach applies machine learning to unconstrained and unstructured raw data from a simulation output to cluster the fails into smaller instructive groups that help a design verification engineer prioritize and debug the fails in the simulation. This unstructured simulation data can be composed of high level design language signals, high level design language coverage events, programming language events, or analysis tool output (e.g., gate utilization analysis tools for power, performance analysis tools, etc.). The process then feeds back its clustering designations to a text or user interface where the process annotates the cluster membership for each fail instance.

Figure 4:
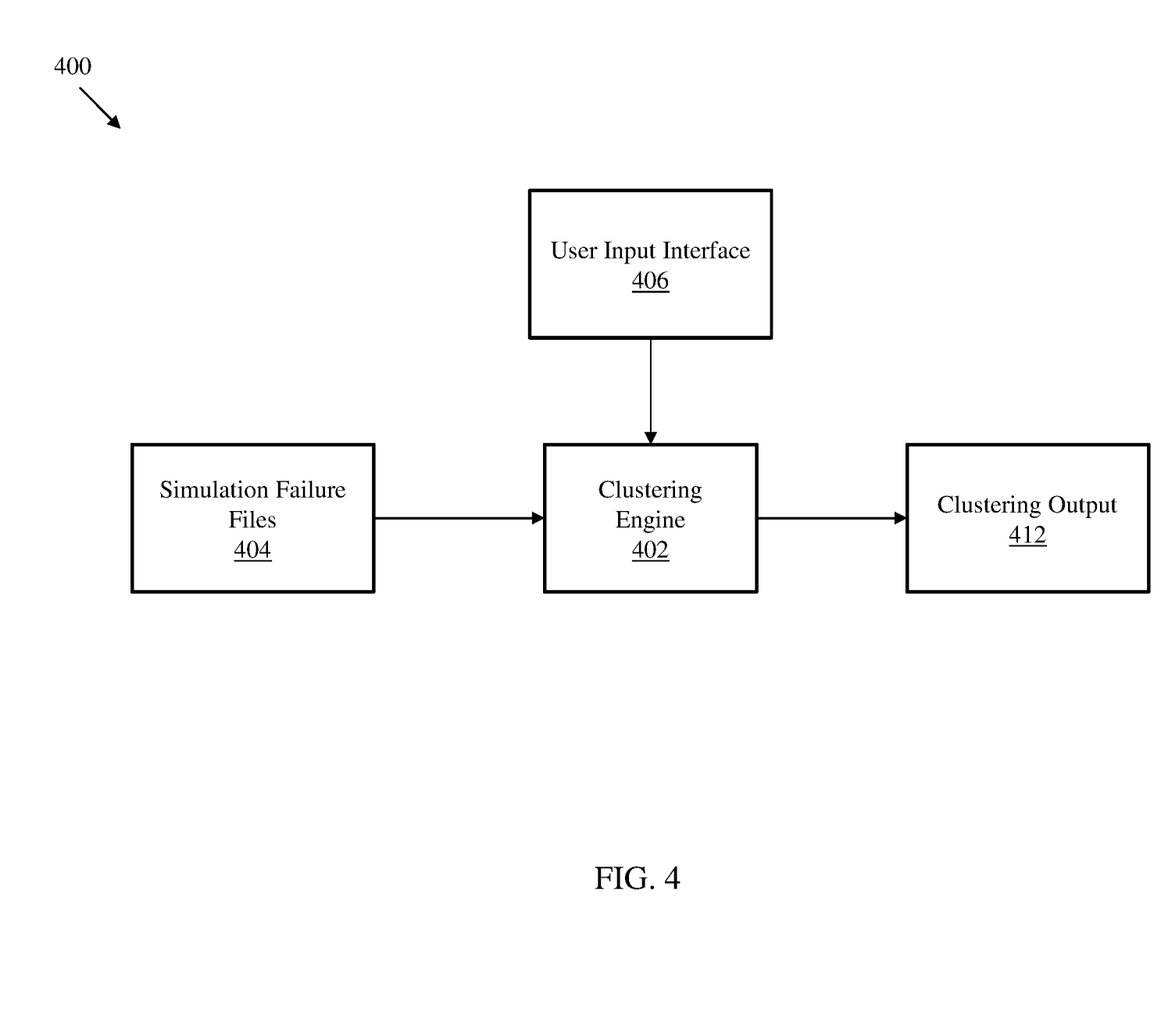
FIG. 4 depicts a block diagram of a system for clustering simulation failures according to one or more embodiments of the present invention.

Turning now to a more detailed description of aspects of the present invention, FIG. 4 depicts a system for clustering test failures in a simulation environment according to embodiments of the invention. The system 400 includes a clustering engine 402 that can receive simulation failure files 404 as well as user inputs through a user input interface 406. Herein, simulation failure can include test case failures as well as verification areas that do not rely on test-cases for stimuli and checking (such as command driven environment) that rely on randomized parameters for hardware stimulation, initializations, and instruction streams. The clustering engine 402 can output to a clustering output 412. In one or more embodiments of the invention, the system 400 takes in simulation failure files 404 which can originate from a microprocessor simulation environment. For example, microprocessor verification environments utilize an encompassing software environment around a high level design (HLD) to provide not only stimulus but also design bug detection. This environment can contain a plethora of software debug statements for failure detection validation as well as for failure analysis. Other common components of a verification environment include tools that extract internal signals of the HLD for debug analysis and for common tool methodologies such as power analysis, performance analysis, and the like. This verification environment output can include the simulation failure files 404. These simulation failure files 404 can be analyzed by the clustering engine 402 to cluster (or group) these simulation failure files into smaller distinctive groups based on common characteristics utilizing machine learning models. In one or more embodiments of the invention, the machine learning models can be an unsupervised machine learning model. In some embodiments, the unsupervised machine learning model can be a clustering algorithm. Unsupervised learning can utilize additional learning/training methods including, for example, clustering, anomaly detection, neural networks, deep learning, and the like.

In one or more embodiments of the invention, the clustering engine 402 analyzes the simulation failure files 404 to discover relations in the data that are typically unknown to a user or engineer. The clustering engine 402 can utilize unsupervised machine learning models to extract features from the unstructured simulation failure files 404 of the simulations. A feature vector can be built by the clustering engine 402 and plotted in a multidimensional plane based on the number of features utilized in the feature vectors. The clustering engine 402 can group these simulation failure files 404 together based on a distance measured between the plotted feature vectors.

In one or more embodiments of the invention, the simulation failure files 404 can be automatically sent to the clustering engine 402 or a user or engineer can input a selected group of simulation failure files 404 into the clustering engine 402 through the user input interface 406 of the system 400. In one or more embodiments of the invention, the simulation failure files 404 can be in a text format. Since these files are in text format, a set of features can be defined to represent each file as a vector of numerical values. This can be performed utilizing a regular expression to define a token (i.e., a word or group of words), then all the tokens present in each file in the simulation failure files 404 are extracted. This process may be referred to as tokenization. The frequency of occurrence of each token in each file is computed by the clustering engine 402. This frequency of occurrence represents the score of the token in each file (e.g., token score). Assuming a set of N simulation failure files 404 (e.g., text files) and a variable D representing the number of tokens in a vector for each file, a D×N matrix can be obtained containing the token scores of all D tokens in all the simulation failure files 404.

In one or more embodiments of the invention, the clustering engine 402 can create the previously mentioned score matrix that would include a variety of scoring ranges. Large variations in the scoring ranges can result in unwanted weighting for the distance calculation of the vectors and affect the clustering of these simulation failure files 404. To avoid this weighting issue, the clustering engine can utilize a smart weighting scheme so that tokens that are common in most of the simulation failure files 404 are given less weight compared to tokens that are present in a small subset of the files. In some cases, discriminating features are not present in all the available simulation files; instead discriminating features appear in a subset of the simulation failure files that constitutes a target cluster. On the other hand, common tokens such as "input" are very general and will likely appear in all files. In practice, if the token appears in all the files, it does not play any role in the clustering scheme because it is not discriminative, hence its token score is reduced. But for tokens that appear in a portion of the files, these tokens are likely discriminative, and they help identify the cluster formed by these files; hence, its token score is increased. This will allow the weight given to a particular token to be dependent on the likelihood of this token being discriminative.

In one or more embodiments of the invention, the feature vectors are plotted in a multidimensional plot and a distance matrix for the simulation failure files 404 can be created by the clustering engine 402. In some embodiments, based on the distance matrix, grouping of the simulation failure files 404 can be performed while considering the different number of clusters (or groups). An optimal number of clusters (or groups) can be determined based on the distances between the different groups. In other embodiments, a user can set a maximum number of groups that can be utilized for clustering the simulation failure files 404. After tokenization, each file instance is represented by a numeric vector of token scores. Distance between two instances can be defined as any measure of distance between two numeric vectors; examples of such distance metrics include absolute difference, Euclidean distance, relative difference, and the like. After defining the distance metric, pairwise distances between all pair of instances can be computed. Next, grouping is performed based on the pairwise distances. The details of the grouping depend on the particular machine learning clustering algorithm used. One example is using hierarchical clustering where instances or clusters that have the minimum distance are sequentially merged until the desired number of clusters is obtained. In other clustering scheme such as k-means, cluster centers are defined, and instances are mapped to the closest center. For a particular grouping run, the number of clusters should be determined before grouping; however, the clustering engine 402 can run grouping for different number of clusters and choose the optimal one based on the distance metric.

In one or more embodiments of the invention, the clustering engine 402 can output to a clustering output 412 via a user interface or display showing the different clusters or groups of simulation failure files 404. In one or more embodiments, these groupings can be presented to a user in the clustering output 412 in the form of a new column in a fail table or in groups plotted against themselves with shaded or color boxes indicating a distance between each group of simulation failure files 404.

In one or more embodiments of the invention, the simulation failure files 404 can be pre-processed before being analyzed by the clustering engine 402. For example, certain tokens can be removed prior to any clustering operations are performed to reduce processing time or to avoid issues with the results. These removed tokens can sometimes be referred to as extraneous tokens in the simulation failure files.

In one or more embodiments of the invention, the clustering engine 402 can be implemented on the processing system 300 found in FIG. 3. Additionally, the cloud computing system 50 can be in wired or wireless electronic communication with one or all of the elements of the system 400. Cloud 50 can supplement, support or replace some or all of the functionality of the elements of the system 400. Additionally, some or all of the functionality of the elements of system 400 can be implemented as a node 10 (shown in FIGS. 1 and 2) of cloud 50. Cloud computing node 10 is only one example of a suitable cloud computing node and is not intended to suggest any limitation as to the scope of use or functionality of embodiments of the invention described herein.

Figure 5:
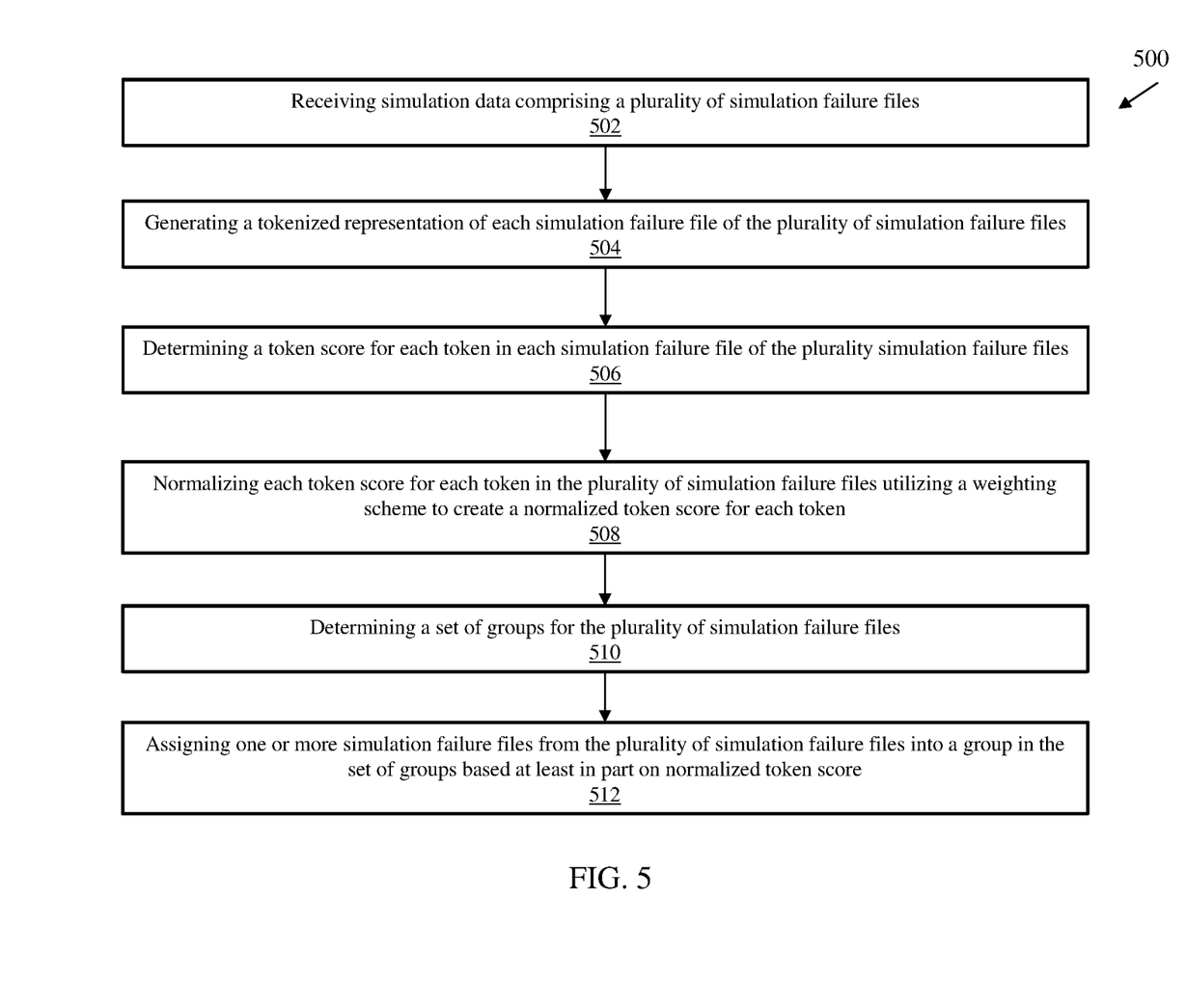
FIG. 5 depicts a flow diagram of a method for clustering test failure files into clusters of smaller instructive groups of similar failure files according to one or more embodiments of the invention.

FIG. 5 depicts a flow diagram of a method for clustering test failure files into clusters of smaller instructive groups of similar failure files according to one or more embodiments of the invention. The method 500 includes receiving simulation data comprising a plurality of simulation failure files, as shown in block 502. At block 504, the method 500 includes generating a tokenized representation of each simulation failure file of the plurality of simulation failure files. Also, the method 500, at block 506, includes determining a token score for each token in each simulation failure file of the plurality simulation failure files. And at block 508, the method 500 includes normalizing each token score for each token in the plurality of simulation failure files utilizing a weighting scheme to create a normalized token score for each token. The method 500 also includes determining a set of groups for the plurality of simulation failure files, as shown at block 510. And at block 512, the method 500 includes assigning one or more simulation failure files from the plurality of simulation failure files into a group in the set of groups based at least in part on a normalized token score.

Additional processes may also be included. It should be understood that the processes depicted in FIG. 5 represent illustrations, and that other processes may be added or existing processes may be removed, modified, or rearranged without departing from the scope and spirit of the present disclosure.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer-implemented method for clustering simulation failures, the method comprising:
    receiving simulation data comprising a plurality of simulation failure files;
    generating a token for each simulation failure file of the plurality of simulation failure files;
    determining a token score for each token for each simulation failure file of the plurality simulation failure files;
    normalizing each token score for each token in the plurality of simulation failure files utilizing a weighting scheme to create a normalized token score for each token;
    determining a set of groups for the plurality of simulation failure files;
    assigning one or more simulation failure files from the plurality of simulation failure files into a group in the set of groups based at least in part on normalized token score, wherein the set of groups comprises a number of groups set by a user input;
    determining one or more extraneous tokens in the plurality of simulation failure files; and
    removing the one or more extraneous tokens from the plurality of simulation failure files prior to determining the token score; and
    displaying, on a user interface, each group in the set of groups.

2. The computer-implemented method of claim 1, wherein assigning the one or more simulation failure files from the plurality of simulation failure files into a group in the set of groups comprises:
    generating, using a machine learning model, a plurality of feature vectors each comprising a plurality of features associated with the plurality of simulation failure files;
    determining a distance between each feature vector in the plurality of feature vectors;
    wherein the assigning the one or more simulation failure files to a group is based at least in part on the distance.

3. The computer-implemented method of claim 2, wherein the machine learning model comprises an unsupervised machine learning model.

4. The computer-implemented method of claim 2, wherein determining the set of groups comprises:
    computing a distance matrix for the plurality of features vectors; and
    determining an optimal number of groups for the set of groups based at least in part on the distance matrix.

5. The computer-implemented method of claim 1, wherein determining the set of groups is based at least in part on a user input, wherein the user input comprises an optimal number of groups for the set of groups.

6. The computer-implemented method of claim 1, wherein the plurality of simulation failure files are in a text format.

7. The computer-implemented method of claim 1, wherein the token score comprises a frequency of the token appearing in each of the plurality of simulation failure files.

8. The computer-implemented method of claim 1, wherein determining the one or more extraneous tokens comprises a user input.

9. A system for clustering simulation failures, the system comprising a processor communicatively coupled to a memory, the processor configured to:
    receive simulation data comprising a plurality of simulation failure files;
    generate a token for each simulation failure file of the plurality of simulation failure files;

determine a token score for each token in each simulation failure file of the plurality simulation failure files;

normalize each token score for each token in the plurality of simulation failure files utilizing a weighting scheme to create a normalized token score for each token;

determine a set of groups for the plurality of simulation failure files; and assign one or more simulation failure files from the plurality of simulation failure files into a group in the set of groups based at least in part on normalized token score, wherein the set of groups comprises a number of groups set by a user input;

determine one or more extraneous tokens in the plurality of simulation failure files; and remove the one or more extraneous tokens from the plurality of simulation failure files prior to determining the token score; and display, on a user interface, each group in the set of groups.

10. The system of claim 9, wherein assigning the one or more simulation failure files from the plurality of simulation failure files into a group in the set of groups comprises:

generating, using a machine learning model, a plurality of feature vectors each comprising a plurality of features associated with the plurality of simulation failure files;

determining a distance between each feature vector in the plurality of feature vectors;

wherein the assigning the one or more simulation failure files to a group is based at least in part on the distance.

11. The system of claim 10, wherein the machine learning model comprises an unsupervised machine learning model.

12. The system of claim 10, wherein determining the set of groups comprises:

computing a distance matrix for the plurality of features vectors; and determining an optimal number of groups for the set of groups based at least in part on the distance matrix.

13. The system of claim 9, wherein determining the set of groups is based at least in part on a user input, wherein the user input comprises an optimal number of groups for the set of groups.

14. A computer program product for clustering simulation failures, the computer program product comprising a computer readable storage medium having program instructions embodied therewith, the program instructions executable by a processor to cause the processor to perform a method comprising:

receiving simulation data comprising a plurality of simulation failure files;

generating a token for each simulation failure file of the plurality of simulation failure files;

determining a token score for each token in each simulation failure file of the plurality simulation failure files;

normalizing each token score for each token in the plurality of simulation failure files utilizing a weighting scheme to create a normalized token score for each token;

determining a set of groups for the plurality of simulation failure files; and assigning one or more simulation failure files from the plurality of simulation failure files into a group in the set of groups based at least in part on normalized token score, wherein the set of groups comprises a number of groups set by a user input;

determining one or more extraneous tokens in the plurality of simulation failure files; and removing the one or more extraneous tokens from the plurality of simulation failure files prior to determining the token score; and displaying, on a user interface, each group in the set of groups.

15. The computer program product of claim 14, wherein assigning the one or more simulation failure files from the plurality of simulation failure files into a group in the set of groups comprises:

generating, using a machine learning model, a plurality of feature vectors each comprising a plurality of features associated with the plurality of simulation failure files;

determining a distance between each feature vector in the plurality of feature vectors;

wherein the assigning the one or more simulation failure files to a group is based at least in part on the distance.

16. The computer program product of claim 15, wherein the machine learning model comprises an unsupervised machine learning model.

17. The computer program product of claim 15, wherein determining the set of groups comprises:

computing a distance matrix for the plurality of features vectors; and determining an optimal number of groups for the set of groups based at least in part on the distance matrix.

18. The computer program product of claim 14, wherein determining the set of groups is based at least in part on a user input, wherein the user input comprises an optimal number of groups for the set of groups.

* * * * *